United States Patent [19]
Chakrabarti et al.

[11] Patent Number: 5,668,049
[45] Date of Patent: Sep. 16, 1997

[54] METHOD OF MAKING A GAAS-BASED LASER COMPRISING A FACET COATING WITH GAS PHASE SULPHUR

[75] Inventors: Utpal Kumar Chakrabarti, Allentown, Pa.; William Scott Hobson, Summit, N.J.; Fan Ren, Warren, N.J.; Melinda Lamont Schnoes, South Amboy, N.J.

[73] Assignee: Lucent Technologies Inc., Murray Hill, N.J.

[21] Appl. No.: 692,834

[22] Filed: Jul. 31, 1996

[51] Int. Cl.$^6$ .................................................. H01L 21/20
[52] U.S. Cl. ........................... 438/33; 372/49; 438/46
[58] Field of Search ........................... 437/129; 372/49

[56] References Cited

U.S. PATENT DOCUMENTS

| | | | |
|---|---|---|---|
| 5,063,173 | 11/1991 | Gasser et al. | 437/129 |
| 5,171,706 | 12/1992 | Matsumoto et al. | 437/129 |
| 5,177,031 | 1/1993 | Buchmann et al. | 437/129 |
| 5,180,685 | 1/1993 | Yamamoto et al. | 437/129 |
| 5,260,231 | 11/1993 | Kawanishi et al. | 437/129 |
| 5,346,855 | 9/1994 | Byrne et al. | 437/129 |

OTHER PUBLICATIONS

"Infrared Microscopy Studies on High–Power InGaAs–GaAs–InGaP Lasers with $Ga_2O_3$ Facet Coatings", by M. Passlack, *IEEE Journal of Selected Topics in Quantum Electronics*, vol. 1, No. 2, Jun. 1995, p. 110.

"Simple Method for Examining Sulphur Passivation of Facets in InGaAs–AlGaAs ($\lambda=0.98$ μm) laser diodes", by G. Beister et al., *Appl. Phys. Lett.*, vol. 68 (18), 29 Apr. 1996, pp. 2467–2468.

*Primary Examiner*—Charles L. Bowers, Jr.
*Assistant Examiner*—Ramamohan Rao Paladugu
*Attorney, Agent, or Firm*—Eugen E. Pacher

[57] ABSTRACT

In a method of making a GaAs-based semiconductor laser, a fully processed wafer is cleaved, typically in the ambient atmosphere, into laser bars, the laser bars are loaded into an evacuable deposition chamber (preferably an ECR CVD chamber) and exposed to a $H_2S$ plasma. Following the exposure, the cleavage facets are coated in the chamber with a protective dielectric (preferably silicon nitride) layer. The method can be practiced with high through-put, and can yield lasers (e.g., 980 nm pump lasers for optical fiber amplifiers) capable of operation at high power.

6 Claims, 1 Drawing Sheet

METHOD OF MAKING A GAAS-BASED LASER COMPRISING A FACET COATING WITH GAS PHASE SULPHUR

BACKGROUND OF THE INVENTION

GaAs-based semiconductor lasers are known and play a significant technological role. For instance, GaAs-based quantum well lasers emitting at about 0.98 µm are inter alia used for pumping Er-doped optical fiber amplifiers in optical fiber communication systems.

In order to protect such lasers against deterioration and/or failure, the laser facets generally are coated with a layer (or layers) of insulator. This is particularly important in high power lasers such as the above referred-to 0.98 µm pump lasers. If uncoated, such lasers frequently fail catastropically, due typically to a high surface state density caused by the presence of native oxides of GaAs-based materials.

A variety of facet coatings and facet coating techniques are known. See, for instance, M. Passlack et al., *IEEE Journal of Selected Topics in Quantum Electronics*, Vol. 1(2), p. 110, June 1995, which discloses $Ga_2O_3$ facet coating. Other known coatings are SiO, $SiO_2$, $SiN_x$, $ZrO_2$, and ZnSe. Vacuum cleaving and in situ deposition of Si on the laser facets has proven to provide effective passivation for 980 nm lasers. See, for instance, U.S. Pat. No. 5,063,173. However, this process is of limited manufacturing utility, due to its typically extremely low through-put, as a consequence of the need for cleaving in vacuum. Such vacuum cleaving typically results in loss of an appreciable portion (~half) of the processed wafer, and furthermore typically permits passivation of only a single laser bar at a time.

$(NH_4)_2S$ wet chemical treatment of GaAs-based lasers has been found to reduce the surface recombination velocity by slight etching and formation of stable Ga-S and As-S bonds. See, for instance, U.S. Pat. No. 5,177,031, and G. Beister et al., *Applied Physics Letters*, Vol. 68(18), pp. 2467–2468 (April 1996). This method however typically provides only temporary passivation because the facets will re-oxidize, especially under high power operation. The wet chemical treatment is also difficult to control, and may result in deterioration of the optical quality of the facets, due to differences in the etch rates of the various layers.

In view of the importance of high power GaAs-based lasers for, e.g., optical fiber communications, it would be desirable to have available an effective and convenient facet passivation treatment suitable for use in a manufacturing process. This application discloses such a treatment.

THE INVENTION

Figure 1:
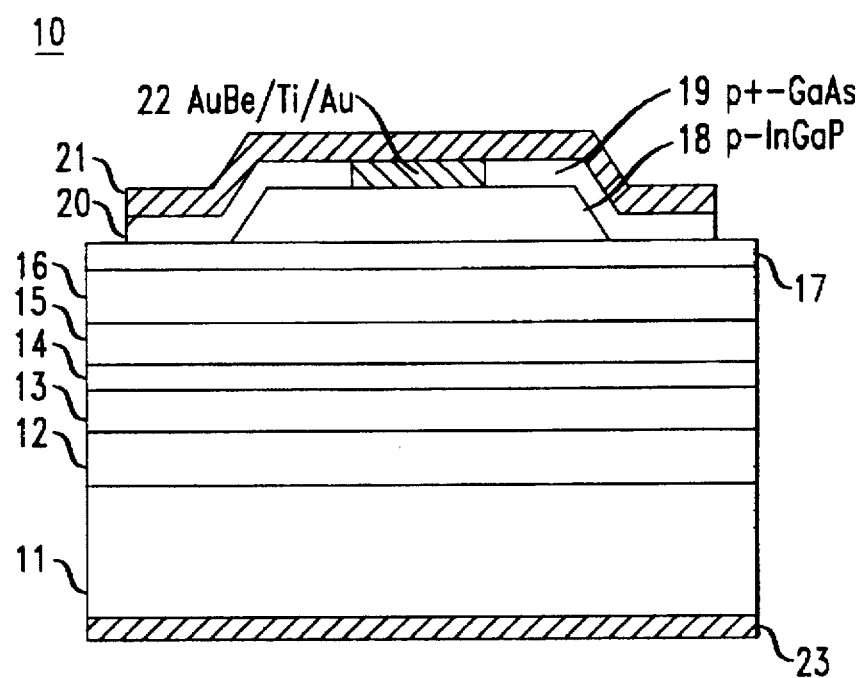
FIG. 1 shows schematically an exemplary laser structure.

In a broad aspect the invention is embodied in a process of making a GaAs-based semiconductor laser, the process comprising advantageous facet passivation.

More specifically, the method comprises providing a body (exemplarily a 3 inch wafer) comprising a GaAs substrate with a Ga- and As-containing semiconductor multilayer structure thereon, cleaving the body into one or more laser bars, introducing the laser bar(s) into an evacuable deposition chamber, depositing a passivation layer on the cleavage surfaces of the laser bar(s), and separating a given laser bar into laser chips.

Significantly, the method comprises exposing, prior to depositing of the passivation layer, the laser bar(s) in the evacuated deposition chamber to a plasma of $H_2S$, and depositing, without exposing the laser bar(s) to the atmosphere, a dielectric layer (preferably a layer of silicon nitride ($SiN_x$)) on the cleavage surface. The value of x will typically be in the approximate range ½–⅔.

In a preferred embodiment the dielectric layer deposition is electron cyclotron resonance (ECR) chemical vapor deposition, since this deposition method produces little damage and exemplarily results in a silicon nitride film that conformably encapsulates the $H_2S$ plasma-treated surfaces.

After deposition of the dielectric layer the laser bar may be given a light thermal anneal, exemplarily 30 minutes at about 200° C. in an inert atmosphere, e.g., Ar. Separation of the laser bar into laser chips can be conventional.

FIG. 1 schematically depicts an exemplary GaAs-based semiconductor laser 10 in cross section. Reference numerals 11–16 refer respectively, to the n-GaAs substrate (10° off (100) toward (111) A), n-InGaP cladding layer (~1.15 µm thickness), GaAs confinement layer (100 nm), InGaAs quantum well (7 nm), GaAs confinement layer (100 nm), and lower portion of the p-InGaP cladding layer (120 nm). Reference numerals 17–19 refer, respectively, to p-GaAs stop etch layer (6 nm), the upper portion of the p-InGaP cladding layer (~1.04 µm), and a $p^+$ GaAs contact layer (120 nm). Etch stop layer 17 facilitates the mesa etch and has essentially no effect on the optical properties of the laser. Reference numerals 20–22 refer, respectively, to a $SiO_2$ layer (e.g., 300 nm), Ti/Pt/Au metallization, and AuBe/TiAu p-side contact. Numeral 23 refers to a AuGe/Ni/Ti/Pt/Au n-side contact.

Methods of making the multilayer structure of FIG. 1 are known and do not require discussion. See, for instance, M. Passlack et al., op. cit.

After completion of a mesa-etched, metallized multilayer wafer, the wafer surface typically is scribed to define the individual laser chips, and laser bars are formed by cleavage along (110) planes. It should be noted that the instant process does not require cleaving under vacuum. This is a substantial advantage over those prior art passivation processes that require cleaving in vacuum and in-situ passivation.

As those skilled in the art will recognize, effective passivation is typically most needed at the front (output) facet of the laser, since optical power density typically is much higher at that facet than at the rear facet. The former typically is provided with a low reflectivity (LR) coating (e.g., 1% reflectivity), whereas the latter typically is provided with a high reflectivity (HR) coating (e.g., 98% reflectivity).

Thus, in one embodiment of the inventive method one cleaved facet of the laser bars is provided with a conventional HR coating (e.g., a known $SiO_2$-Si distributed Bragg reflector) without passivation, followed by plasma passivation and deposition of a known LR coating on the other facet of the laser bar, the LR coating comprising the dielectric protective layer.

In a further embodiment of the invention both laser bar facets are simultaneously plasma passivated, followed by simultaneous deposition of an appropriate protective layer, typically silicon nitride, optionally followed by deposition of further dielectric layers to yield a conventional HR coating and/or a conventional LR coating on the respective facets.

In either case, a multiplicity (e.g., hundreds or even thousands) of laser bars can readily be treated simultaneously in the reaction chamber, for instance with the aid of a simple jig having a multiplicity of slots that can receive the laser bars and maintain them on edge, such that either one or both facets of a given laser bar are exposed to the plasma in the reaction chamber.

After placement of a loaded jig into an appropriate evacuable reaction chamber, the chamber is evacuated (typically to $10^{-6}$ Torr or less), and the laser bars are exposed to a passivating plasma formed from $H_2S$. Advantageously this is carried out in an electron cyclotron resonance (ECR) machine, in order to minimize damage to the facets. Such machines are known, and are commercially available. Exemplarily, ECR power was in the approximate range 200–1000 W, the $H_2S$ flow rate into the reaction chamber was about 10 sccm, the pressure in the chamber during passivation was about 2 mTorr, and exposure to the plasma lasted about 2 minutes. These parameters are at least to some extent machine-dependent, and parameter ranges thus can typically not be specified in general. However, a minor amount of experimentation will typically suffice to determine appropriate parameter values for a specific machine.

We currently believe that hydrogen in the plasma removes the native oxides from the facets, and that sulfur in the plasma bonds with Ga and As, thereby lowering the surface state density of the facets. Since essentially no etching of the facets result from the exposure to the $H_2S$ plasma, the optical quality of the cleaved facets is preserved, overcoming one of the shortcomings of at least some prior art passivation processes.

After completion of the exposure to the $H_2S$ plasma the protective dielectric layer is deposited over the cleavage facets. In preferred embodiments the dielectric layer is a silicon nitride layer formed by ECR CVD from $SiH_4$ and $N_2$ in known manner.

We subjected 980 nm lasers, of the type shown in FIG. 1 and passivated substantially as described above, to a conventional laser stress test which includes 140 hours stress at 100° C. and 150 mA. Substantially all of the lasers passed the stress test. The lasers also performed satisfactorily at high power with 500 mA drive current.

The invention claimed is:

1. Method of making a GaAs-based semiconductor laser having a cleaved laser facet, the method comprising
   a) providing a body comprising a GaAs substrate with a Ga- and As-containing multilayer semiconductor structure thereon;
   b) cleaving the body into one or more laser bars, a given laser bar having a cleavage surface;
   c) introducing the given laser bar into an evacuable deposition chamber and depositing a dielectric layer on said at least one cleavage surface; and
   d) separating said laser bar into two or more laser chips;
   CHARACTERIZED in that the method comprises
   e) exposing, prior to depositing of the dielectric layer, the cleavage surface in the deposition chamber to a plasma of $H_2S$, and depositing the dielectric layer on the cleavage surface without exposing the laser bar to the ambient atmosphere.

2. Method according to claim 1, wherein the evacuable deposition chamber is an electron cyclotron resonance chemical vapor deposition chamber, and the dielectric layer comprises silicon nitride.

3. Method according to claim 1, wherein a multiplicity of laser bars are introduced into the evacuable deposition chamber and are simultaneously exposed to the plasma of $H_2S$, followed by simultaneous dielectric layer deposition.

4. Method according to claim 1, wherein the dielectric layer is a silicon nitride layer.

5. Method according to claim 4 wherein the silicon nitride layer is formed by electron cyclotron resonance chemical vapor deposition from $SiH_4$ and $N_2$.

6. Method according to claim 1, wherein the laser is selected to have an output wavelength of about 980 nm.

* * * * *